United States Patent
Tzeng et al.

(10) Patent No.: US 7,622,989 B2
(45) Date of Patent: Nov. 24, 2009

(54) MULTI-BAND, INDUCTOR RE-USE LOW NOISE AMPLIFIER

(75) Inventors: Fred Tzeng, Cerritos, CA (US); Amin Jahanian, Irvine, CA (US); Payam Heydari, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 24 days.

(21) Appl. No.: 12/107,266

(22) Filed: Apr. 22, 2008

(65) Prior Publication Data
US 2009/0021307 A1  Jan. 22, 2009

Related U.S. Application Data (60) Provisional application No. 60/915,039, filed on Apr. 30, 2007.

(51) Int. Cl.
*H03F 3/68* (2006.01)
(52) U.S. Cl. .......................... 330/126; 330/306
(58) Field of Classification Search ................. 330/311, 330/306, 126, 295, 124 R
See application file for complete search history.

(56) References Cited

U.S. PATENT DOCUMENTS

| | | | |
|---|---|---|---|
| 7,023,272 B2* | 4/2006 | Hung et al. | 330/126 |
| 7,057,457 B2* | 6/2006 | Irvine et al. | 330/252 |
| 7,167,044 B2* | 1/2007 | Li et al. | 330/129 |
| 2008/0211586 A1* | 9/2008 | Galan | 330/302 |

OTHER PUBLICATIONS

Tzeng et al., *A Multiband Inductor-Reuse CMOS Low-Noise Amplifier*, IEEE Transactions on Circuits and Systems, II: Express Briefs, vol. 55, No. 3, pp. 209-213 (Mar. 2008).

Hashemi et al., *Concurrent Multiband Low-Noise Amplifiers-Theory, Design, and Applications*, IEEE Transactions on Microwave Therapy and Technique, vol. 50, No. 1, pp. 288-301 (Jan. 2002).

Li et al., *A Dual-Band CMOS Front-End with Two Gain Modes for Wireless LAN Applications*, IEEE Journal on Solid-State Circuits, vol. 39, No. 11, pp. 2069-2073 (Nov. 2004).

Ranjit Gharpurey, *A Broadband Low-Noise Front-End Amplifier for Ultra Wideband in 0.13 μm CMOS*, IEEE Journal on Solid-State Circuits, vol. 40, No. 9, pp. 1983-1986 (Sep. 2005).

(Continued)

*Primary Examiner*—Robert Pascal
*Assistant Examiner*—Hieu P Nguyen
(74) *Attorney, Agent, or Firm*—Orrick, Herrington & Sutcliffe LLP (57) ABSTRACT

Described herein are multi-band LNAs that reuse inductors for different frequency bands to minimize chip area. In an embodiment, a multi-band LNA is capable of operating in a narrowband (NB) and a wideband (WB) while reusing at least one input impedance matching inductor and at least one load inductor for both bands. The reuse of inductors results in a more efficient use of chip area. In an exemplary embodiment, the LNA comprises a common source transistor and a common gate transistor. In this embodiment, the LNA operates in a common source configuration using the common source transistor to amplify input signals in the NB, and operates in a common gate configuration using the common gate transistor to amplify input signals in the WB. The LNA reuses an input impedance matching inductor and a load inductor in both configurations, and thus both bands.

23 Claims, 12 Drawing Sheets

OTHER PUBLICATIONS

Lee et al., *A SiGe Low Noise Amplifier for 2.4/5.2/5.7 GHz WLAN Applications*, 2003 IEEE International Solid-State Circuits Conference, Session 20, Wireless Local Area Networking, Paper 20.8, 8 pages.

Lu et al., *A Compact 2.4/5.2 GHz CMOS Dual-Band Low-Noise Amplifier*, IEEE Microwave and Wireless Components Letters, vol. 15, No. 10, pp. 685-687 (Oct. 2005).

Adiseno et al., *A 1.8-V Wide-Band CMOS LNA for Multiband Multistandard Front-End Receiver*, IEEE, pp. 141-144 (Apr. 3, 2003).

Hyvonen et al., *An ESD-Protected, 2.45/5.25 GHz Dual-Band CMOS LNA with Series LC Loads and a 0.5-V Supply*, IEEE Radio Frequency Integrated Circuits Symposium, pp. 43-46 (Feb. 5, 2005).

\* cited by examiner

TABLE I
ADDITIONAL PERFORMANCE PARAMETERS

TC LNA

| | 802.11b/g | PSB | 802.11a low./mid. | 802.11a upper |
|---|---|---|---|---|
| Band | | | | |
| $s_{12}$ (dB) | -45.3 | -41.1 | -38.1 | -36.5 |
| NF (dB) | 3.1 | 4.1 | 3.8 | 3.4 |
| $P_{-1dB}$ (dBm) | -30.5 | -11.1 | -14.5 | -16.2 |
| IIP3 (dBm) | -21.4 | -2.2 | -5.6 | -6.7 |
| Power | 0.9mA from 1.2V | 0.85mA from 1.2V | 0.85mA from 1.2V | 0.85mA from 1.2V |

TI LNA

| | 802.11b/g | PSB | 802.11a low./mid. | 802.11a upper |
|---|---|---|---|---|
| Band | | | | |
| $s_{12}$ (dB) | -47.3 | -41.4 | -34.9 | -30.8 |
| NF (dB) | 3.1 | 2.7 | 2.7 | 2.6 |
| $P_{-1dB}$ (dBm) | -31.2 | -11.3 | -13.2 | -16.5 |
| IIP3 (dBm) | -21.0 | -1.5 | -3.4 | -5.9 |
| Power | 1.1mA from 1.2V | 4.4mA from 1.2V | 4.4mA from 1.2V | 4.4mA from 1.2V |

FIG. 14

MULTI-BAND, INDUCTOR RE-USE LOW NOISE AMPLIFIER

RELATED APPLICATION

This application claims the benefit of provisional application No. 60/915,039, filed on Apr. 30, 2007, the specification of which is incorporated in its entirety herein by reference.

FIELD OF THE INVENTION

The present invention relates to radio frequency integrated circuits and, more particularly, to a low noise amplifier (LNA) capable of operating in multiple frequency bands.

BACKGROUND OF THE INVENTION

With the proliferation of new standards and applications for next generations of wireless communications, there has been a revolution in traditional integrated circuit (IC) design issues. Instead of designing an individual radio for each of the multiple standards and applications, a more cost-efficient solution would be to design multi-band radios that are capable of reusing blocks and area-consuming passive components for different standards and applications.

A critical block in radios that would greatly benefit from reusing passive components for different standards is the low noise amplifier (LNA), because of its extensive use of area-consuming inductors (or transformers) to achieve low noise, input matching, high gain, high selectivity, and high linearity.

There have been prior works that implement multi-band low noise amplifiers (LNAs). However, such works have their drawbacks.

For instance, in the work of Hashemi et al., "Concurrent multi-band low-noise amplifiers—theory, design, and applications," IEEE J. Solid-State Circuits, vol. 50, No. 1, pp. 228-301, January 2002., higher order LC filters for input matching and for the output load are used in order to realize a concurrent dual band LNA. A drawback of this topology is that spurs in one band can corrupt the signal in the other band.

Quintal et al., "A Dual-band CMOS front-end with two gain modes for wireless LAN applications," IEEE J. Solid-State Circuits, vol. 39, No. 11, pp. 2069-2073, November 2004, uses two common source, inductively degenerated input transistors with a shared source inductor. This topology requires fairly large gate inductors to resonate at the narrow bands of interest. Furthermore, the use of switches to tune out inductors in the load degrades the Q of the tank due to the switch on-resistance and its large parasitic capacitance.

In Hyvonen et al., "An ESD-protected, 2.45/5.25 GHz dual band CMOS LNA with series LC loads and a 0.5-V supply," in IEEE RFIC Symp. Dig., 2005, pp. 43-46, series LC loads provide two separate outputs for each desired frequency, and allows the use of a lower supply voltage due to the use of series resonance. However, this topology uses six inductors, resulting in an increase in chip area.

Another drawback of the previous works discussed above is that they reuse inductors only for two different narrowband frequencies.

Magnusson et al., "An A 1.8-V wide-band CMOS LNA for multi-band multistandard front-end receiver," in IEEE Euro. Solid State Conf. Dig., 2003, pp. 141-144, attains wideband, multi-band matching by using resistors at the expense of lower gain due to resistive feedback, worse noise figure, and lower voltage headroom. L. H. Lu et al., "A compact 2.4/5.2- GHz CMOS dual-band low-noise amplifier," in IEEE Micro. And Wireless Comp. Letters, vol. 15, No. 10, pp. 685-687, October 2005, realizes dual-narrow band operation by switching in an additional transistor; however, using switches at the input degrades noise figure.

SUMMARY

Described herein are multi-band LNAs that reuse inductors for different frequency bands to minimize chip area.

In an embodiment, a multi-band LNA is capable of operating in a narrowband (NB) and a wideband (WB) while reusing at least one input impedance matching inductor and at least one load inductor for both bands. The reuse of inductors results in a more efficient use of chip area.

In an exemplary embodiment, the LNA comprises a common source transistor and a common gate transistor. In this embodiment, the LNA operates in a common source configuration using the common source transistor to amplify input signals in the NB, and operates in a common gate configuration using the common gate transistor to amplify input signals in the WB. The LNA reuses an input impedance matching inductor and a load inductor in both configurations, and thus both bands.

In an embodiment, the LNA comprises a tapped-capacitance (TC) or a tapped-inductor impedance matching network that reuses an inductor to achieve input impedance matching in both bands.

In an embodiment, the LNA comprises a switched capacitor network for tuning the resonance frequency of the LNA's load to different frequency bands, e.g., in the WB.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. It is also intended that the invention is not limited to require the details of the example embodiments.

BRIEF DESCRIPTION OF THE DRAWINGS

FIGS. 13(a) and (b) show the simulated and measured NF of the TC LNA and TI LNA, respectively, according to an embodiment of the present invention.

DETAILED DESCRIPTION

The various embodiments and examples provided herein are generally directed to a low noise amplifier (LNA), typically implemented as the first block of radio frequency integrated receivers. The LNA is used to amplify an extremely sensitive received signal without degrading its signal to noise ratio intolerably.

In one embodiment, a multi-band, inductor-reuse LNA is provided. In one mode, the LNA's input transistor is in a common source configuration, achieving a narrowband (NB) input matching. In the other mode, the LNA's input transistor is in a common gate configuration, achieving a wideband (WB) (~1 GHz) input matching. In both modes, the LNA shares its input matching inductor as well as its load inductor, resulting in a compact layout and efficient use of chip area. The LNA is capable of providing narrowband and wideband input matching. In addition, the LNA utilizes a load inductor sharing method such that the load impedance is degraded minimally, as discussed further below.

Figure 2:
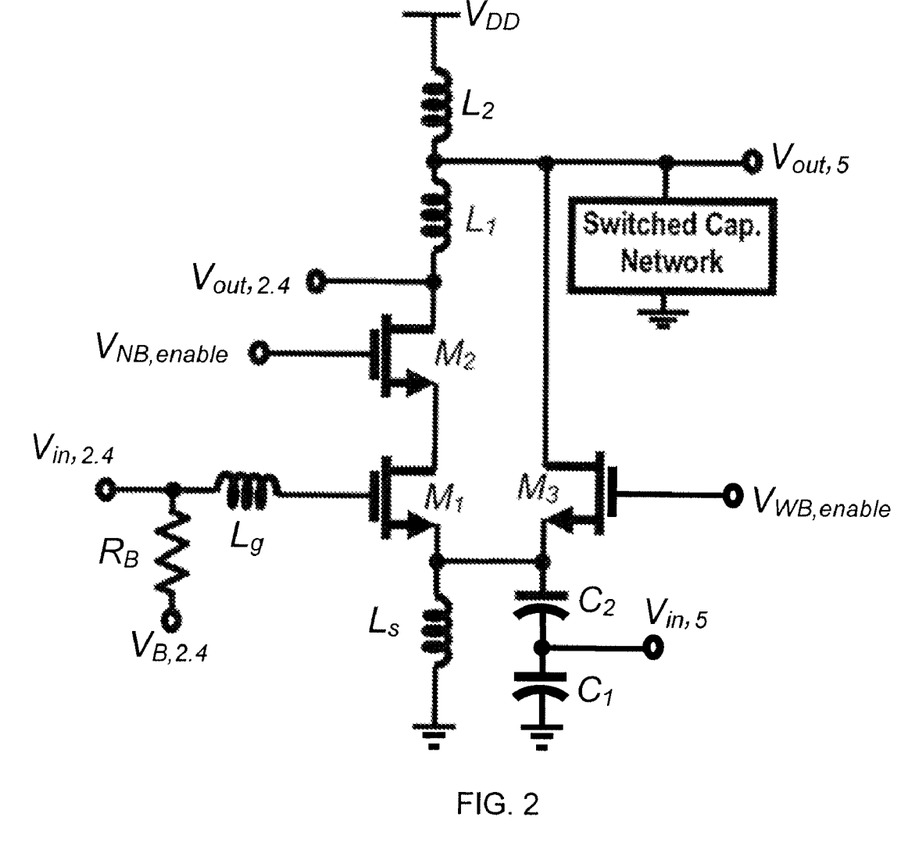
FIG. 2 shows an exemplary tapped-capacitor (TC) LNA according to an embodiment of the present invention.

FIG. 2 shows a multi-band tapped-capacitor (TC) LNA according to an exemplary embodiment of the present invention. A multi-band tapped-inductor (TI) LNA according to another exemplary embodiment will be discussed later. The multi-band TC LNA comprises a common source transistor $M_1$ for a narrowband frequency and a common gate transistor $M_3$ for a wideband frequency range. The LNA also comprises a cascode transistor $M_2$ connected to the drain of the common source transistor $M_1$. The cascode transistor $M_2$ is used to provide stability, reduce input-output feed-through, and decrease the Miller effect. The LNA further comprises impedance matching inductor $L_s$ connected to the sources of transistors $M_1$ and $M_3$, load inductors $L_1$ and $L_2$, and a switched capacitor network. The LNA also comprises series capacitors $C_1$ and $C_2$ connected to inductor $L_s$ to form a tapped-capacitor input matching network. The multi-band TC LNA can operate in a narrowband (NB) mode using the common source transistor $M_1$ and a wideband (WB) mode using the common gate transistor $M_3$. Furthermore, the LNA reuses impedance matching inductor $L_s$ for the NB and the WB mode, and reuses load inductor $L_2$ for the NB mode and the WB mode, resulting in a more efficient use of chip area.

Figure 3:
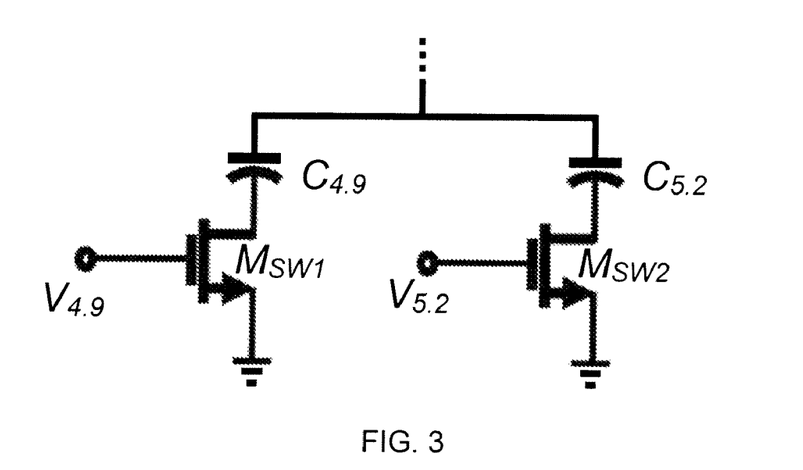
FIG. 3 shows an implementation of a switched capacitor network according to an embodiment of the present invention.

FIG. 3 shows an exemplary implementation of the switched capacitor network, in which the switched capacitor network comprises capacitors $C_{4.9}$ and $C_{5.2}$, and switch transistors $M_{SW1}$ and $M_{SW2}$ connected to capacitors $C_{4.9}$ and $C_{5.2}$, respectively. As discussed further below, the switched capacitor network is used to tune the resonance frequency of the LNA's load for different frequency bands.

Figure 1:
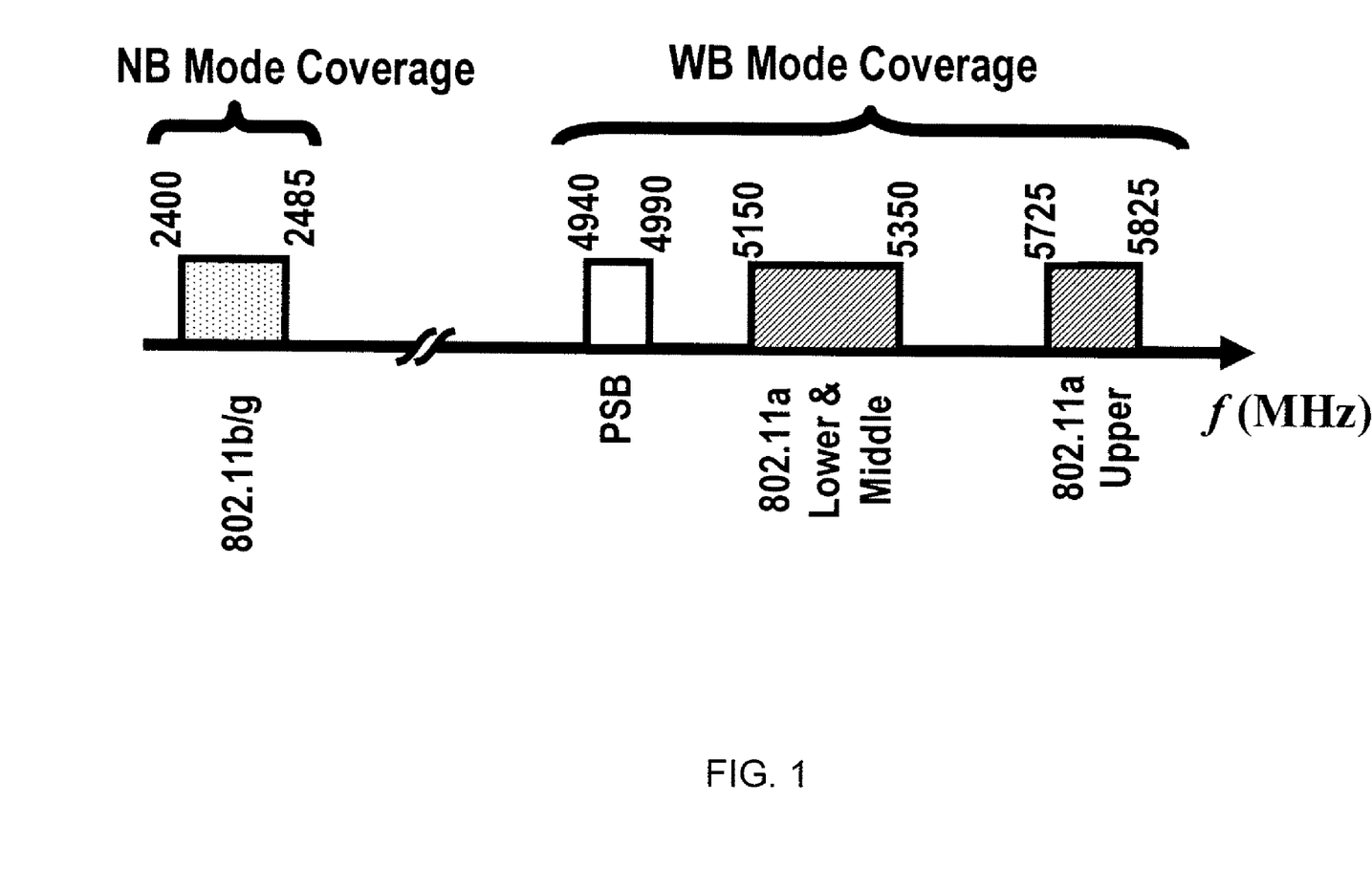
FIG. 1 an example of frequency bandwidths that may be covered by a multi-band LNA according to an embodiment of the present invention.

In an exemplary design, the TC LNA is used for 802.11a/b/g and PSB standards, where the NB mode covers WLAN 802.11b/g at 2.4 GHz, and the WB mode accommodates the PSB at 4.9 GHz and WLAN 802.11a from 5.1-5.9 GHz, as shown in FIG. 1. These frequency bands are exemplary only, as the LNA can be used for other standards and applications using different frequency bands. In the exemplary design, the inductor and capacitor values are $L_g$=16.4 nH, $L_s$=1.3 nH, $L_1$=8 nH, $L_2$=3.4 nH, C1=0.28 pF, C2=2.8 pF, $C_{4.9}$=85 f, and $C_{5.2}$=115 f. The transistors are MOSFETs fabricated using a 0.13 μm CMOS process with dimensions of $M_1$=$M_2$=100/0.12 μm, and $M_3$=60/0.27 μm.

Operation Modes

Figure 4:
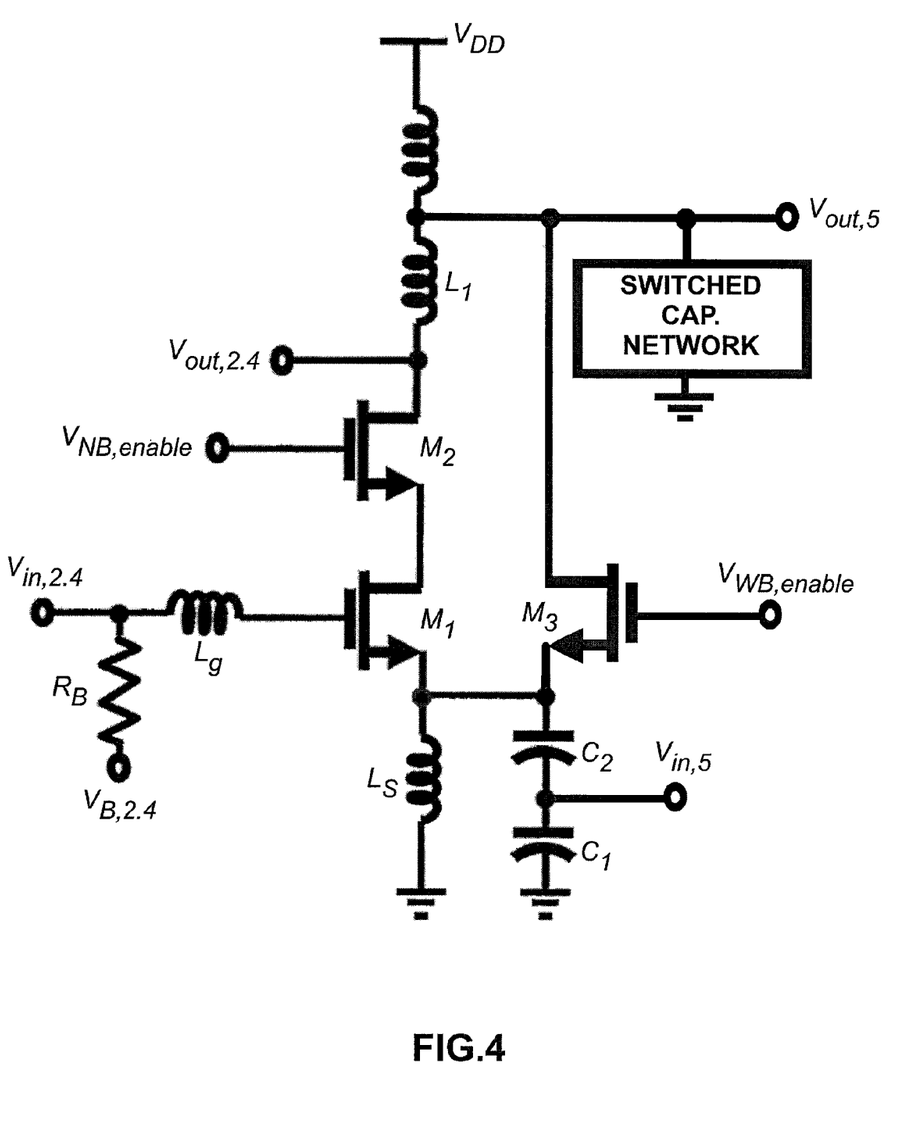
FIG. 4 shows the TC LNA configured as a common source amplifier in a narrowband (NB) mode according to an embodiment of the present invention.

To operate the LNA in the NB mode, $V_{NB,enable}$ of transistor $M_2$ is connected to $V_{DD}$, $V_{B,2.4}$ biases transistor $M_1$ in saturation, and $V_{WB,enable}$ of transistor $M_3$ is grounded. Also, the switched capacitor network is OFF, i.e., $V_{4.9}$ and $V_{5.2}$ of switch transistors $M_{SW1}$ and $M_{SW2}$, respectively, in FIG. 3 are both grounded. As a result, the LNA operates in its common source configuration and provides gain at 2.4 GHz for the 802.11b/g band. The NB frequency of 2.4 GHz is exemplary only, as other NB frequencies may be used. FIG. 4 shows the LNA configured as a NB common source amplifier in the NB mode, in which the active path of the LNA in the NB mode is darkened. The input signal is inputted $V_{in,2.4}$ to the gate of the common source transistor $M_1$ through inductor $L_g$, and the output signal $V_{out,2.4}$ is taken at the drain of transistor $M_2$.

Figure 5:
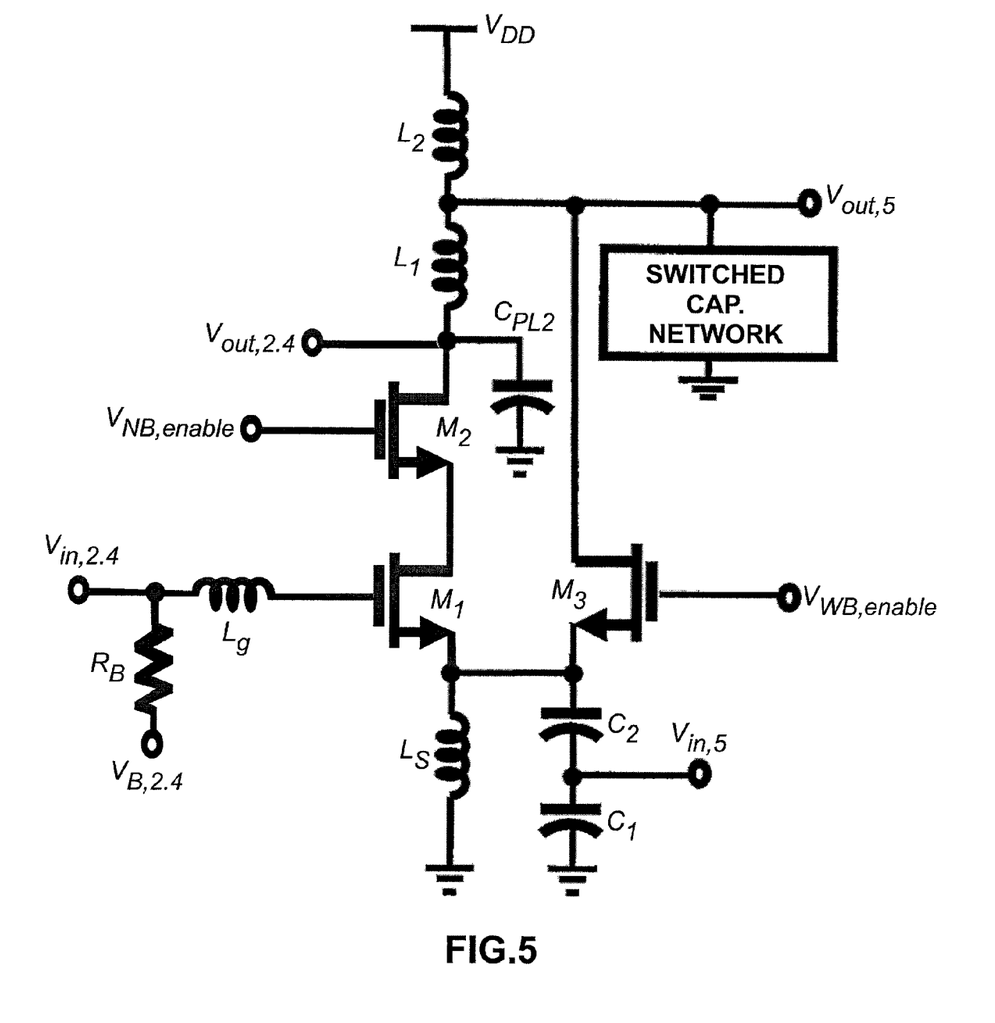
FIG. 5 shows the TC LNA configured as a common gate amplifier in a wideband (WB) mode according to an embodiment of the present invention.

To operate the LNA in the WB mode, $V_{WB,enable}$ biases $M_3$ in saturation and $V_{NB,enable}$ is grounded. $V_{4.9}$ and $V_{5.2}$ of the switched capacitor network are either HIGH or LOW, depending on whether amplification is provided for the PSB, 802.11a lower and middle bands, or the 802.11a upper band (cf. FIG. 1). A detailed analysis of the load and switched capacitor network is provided below. As a result, the LNA operates in its common gate configuration. FIG. 5 shows the LNA configured as a WB common gate amplifier in the WB mode, in which the active path of the LNA in the WB mode is darkened. The input signal $V_{in,5}$ is inputted between the capacitors $C_1$ and $C_2$ of the tapped-capacitor input matching network, and the output signal $V_{out,5}$ is taken at the drain of the common gate transistor $M_3$.

Input Matching and Load Networks

Figure 6A:
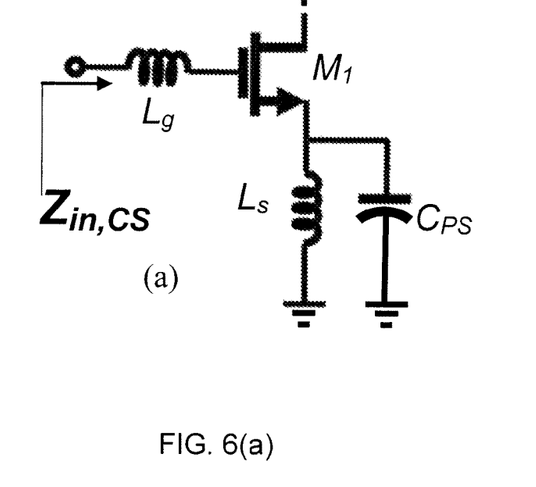
FIGS. 6(a) and 6(b) show the input impedance and load impedance, respectively, for the common source configuration of the LNA according to an embodiment of the present invention.

In the NB configuration, the LNA becomes an inductively degenerated common source LNA with inductors $L_s$ and $L_g$ to provide narrowband input matching at the frequency of interest. Referring to FIG. 6(a), the input impedance of the common source LNA is $$Z_{in,CS} = L_g s + \frac{1}{C_{gs1} s} + \frac{L_s s}{1 + C_{PS} L_s s^2} + \frac{g_{m1} L_s}{(1 + C_{PS} L_s s^2) C_{gs1}} \quad (1)$$

where $g_{m1}$, is the transconductance of $M_1$, $C_{gs1}$ is the gate-source capacitance of $M_1$, and $C_{PS}$ is comprised of the series capacitance of $C_1$ and $C_2$ in parallel with the off-state capacitance seen at the source terminal of $M_3$. The first three terms of equation (1) are the imaginary parts of the input impedance $Z_{in,CS}$, and the last term denotes the real part. The component values should be chosen so as to optimally match the input impedance $Z_{in,CS}$ to the source resistance. Note that the term $1+C_{PS}L_s s^2$ in the denominator of the real part can become negative at high frequencies, possibly degrading stability. In the exemplary design, $L_s$≈1.3 nH and $C_{PS}$≈335 fF. The term becomes negative at 7.7 GHz, where the gain is much less than unity. The stability factor κ is, therefore, greater than 1 for all frequencies of interest, as verified by Cadence simulations.

Figure 6B:
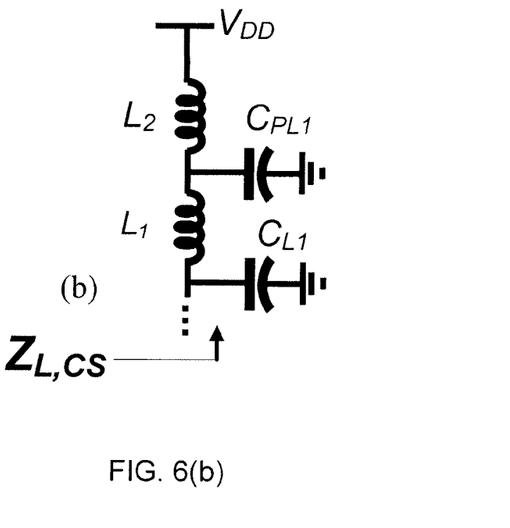

The load impedance of the NB configuration is shown in FIG. 6(b). The load impedance is calculated as $$Z_{L,CS} = \left[L_1 s + \left(L_2 s \| \frac{1}{C_{PL1} s}\right)\right] \| \frac{1}{C_{L1} s} \quad (2)$$

where $C_{PL1}$ is the capacitance arising from the off-state capacitances of the switched capacitor network, transistor $M_3$, and inductors $L_1$ and $L_2$. $C_{L1}$ is parasitic capacitance from transistor $M_2$ and inductor $L_1$. The load impedance $Z_{L,CS}$ in equation (2) should be set to resonate at the frequency of interest, 2.4 GHz, for maximum gain and selectivity. As discussed above, the NB frequency of 2.4 GHz is exemplary only.

Figure 7A:
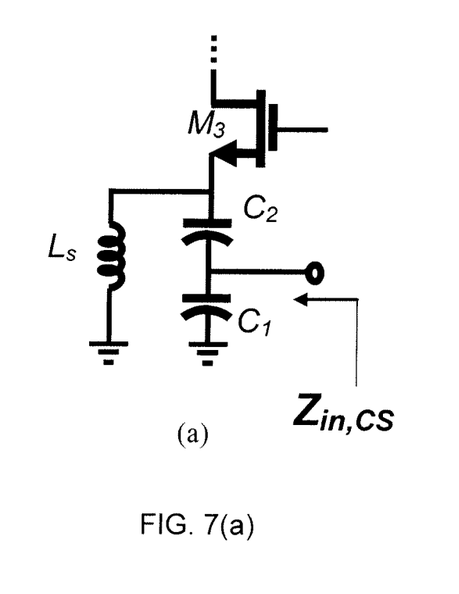
FIGS. 7(a) and 7(b) show the input impedance and load impedance, respectively, for the common gate configuration of the LNA according to an embodiment of the present invention.

In the WB mode, the LNA is reconfigured as a common gate amplifier with a tapped-capacitor input matching network comprised of capacitors $C_1$ and $C_2$, and inductor $L_s$, as shown in FIG. 7(a). The impedance looking into the source of transistor $M_3$, neglecting channel-length modulation, is $1/g_{m3}$, where $g_{m3}$ is the transconductance of $M_3$. For a typical source resistance of 50 Ω, biasing $M_3$ such that $g_{m3}$=20 mS provides optimal matching over wideband frequencies. However, if $g_{m3}$ deviates from 20 mS so as to meet power consumption requirements, then the noise figure, linearity, gain, and input matching can become quite poor. In situations where power consumption is a critical issue, low bias currents inevitably limit $g_{m3}$ to be less than 20 mS. Consequently, $1/g_{m3}$ now becomes greater than 50Ω and needs to be transformed to guarantee good matching. The TC network, in fact, performs downward impedance transformation. Referring to FIG. 7(a), the capacitive divider transforms the input impedance such that the real part of the input impedance is $$\text{Re}[Z_{in,CG}] \approx \left(\frac{C_2}{C_1 + C_2}\right)^2 \cdot \frac{1}{g_{m3}} \quad (3)$$

The imaginary part of the input impedance $Z_{in,CG}$ is resonated out at an angular frequency of $$\omega_{0,CG} \approx \frac{1}{\sqrt{L_s \frac{C_1 C_2}{C_1 + C_2}}} \quad (4)$$

The Q of the network is quantified as $$Q_{CG} = \frac{1}{\omega_{0,CG} L_s g_{m3}} \quad (5)$$

Figure 8:
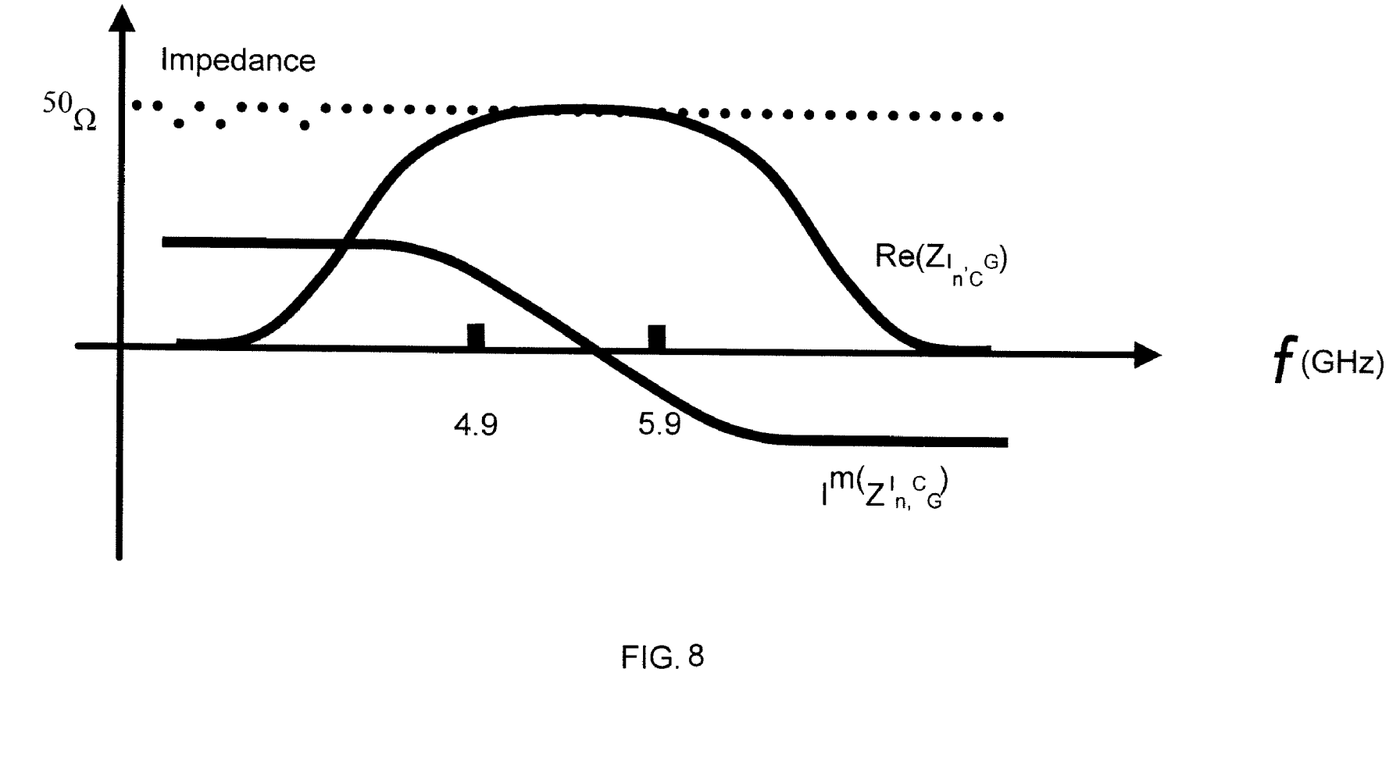
FIG. 8 is a plot of the real and imaginary input impedance for the common gate configuration of the LNA vs. frequency according to an embodiment of the present invention.

From equations (3) and (4), proper selection of $C_1$, $C_2$, and $L_s$ can attain proper matching at the desired resonant frequency. However, because it is desirable to realize wideband input matching from 4.9-5.9 GHz in the exemplary design, the choice of $Q_{CG}$ is vital. In this case, a low $Q_{CG}$ is preferable due to the input impedance's slowly varying real and imaginary responses that achieves close to optimum matching in the desired wideband, as depicted in FIG. 8. This allows the LNA to attain sufficient $s_{11}$ over the wideband of interest.

Furthermore, a low $Q_{CG}$ has additional benefits of causing the input return loss to be insensitive to process variations and parasitics.

Figure 7B:
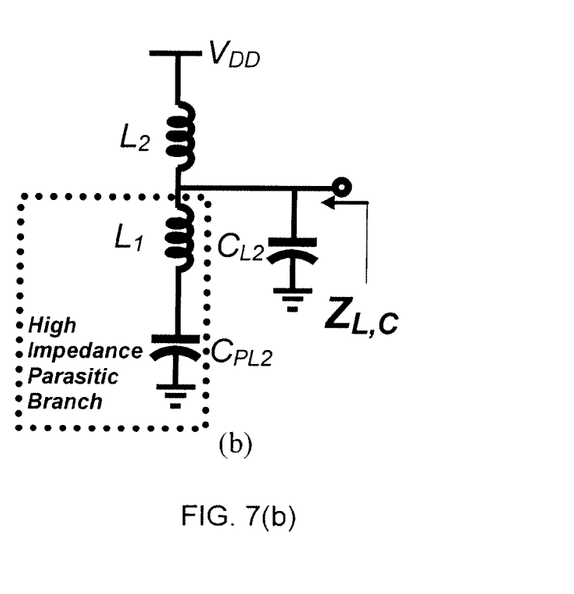

Preferably, the LNA utilizes a new load inductor sharing method such that the load impedance is degraded minimally. The LNA's load impedance in the common gate configuration is depicted in FIG. 7(b). $C_{L2}$ is the capacitance from the switched capacitor network and that of transistor $M_3$, while $C_{PL2}$ arises from the off-state capacitance of $M_2$. The load impedance is $$Z_{L,CG} = \left(L_2 s \| \frac{1}{C_{L2} s}\right) \| \left(L_1 s + \frac{1}{C_{PL2} s}\right) \quad (6)$$

The main resonant tank is composed of the parallel combination of $L_2$ and $C_{L2}$, while the parasitic branch is the series combination of $L_1$ and $C_{PL2}$. In order to minimize the loading effect of the parasitic branch on the main resonant tank, it must be set to high impedance at the frequency of interest. For instance, in the exemplary design, $L_1$=8 nH and $C_{PL2}$≈40 fF, making its series impedance 1050 Ω at 5 GHz. This finite parasitic impedance slightly decreases the impedance at the desired resonant frequency. This is in contrast to Quintal et al., "A Dual-band CMOS front-end with two gain modes for wireless LAN applications," IEEE J. Solid-State Circuits, vol. 39, No. 11, pp. 2069-2073, November 2004, where large switches are employed to short out inductors, which, in turn, introduces significant on-resistance and parasitic capacitance. Instead, our method "switches" inductors by re-directing the signal path and relying on the high impedance of the parasitic branch in FIG. 7(b). This minimizes the gain degradation of the LNA.

The common gate LNA's resonant load can be tuned to either the PSB, 802.11a lower/middle bands, or the 802.11a upper band, by setting $M_{SW1}$ ON and $M_{SW2}$ ON for PSB, 802.11a lower band, $M_{SW1}$ OFF and $M_{SW2}$ ON for PSB, 802.11 middle band, and $M_{SW1}$ OFF and $M_{SW2}$ OFF for the 802.11a upper band.

Conditions for Sharing Inductors

The LNA advantages reuses the same inductors in the two different amplifier configurations. Conditions for sharing the inductors are provided below.

Inductor $L_s$ is reused for both the LNA's common source and common gate input matching networks. For this to happen, equations (1), (3)-(5) must be satisfied concurrently. We first simplify the equations by sizing $L_g$ such that the imaginary part of the input impedance in equation (1) is cancelled out, leaving the real part as the term of interest as $$\text{Re}[Z_{in,CS}] = \frac{g_{m1} L_s}{C_{gs1}} \quad (7)$$

where we have assumed $C_{PS} L_s^2 \ll 1$ in equation (1) for component values given above. Setting equations (3) and (7) equal to a typical source resistance of 50 Ω, and combining (7), (3)-(5) yields $$L_s = \frac{g_{m1} C_2^2}{g_{m3}^3 C_{gs1} Q_{CG}^4} \quad (8)$$

For the exemplary design, $g_{m1}$=18 mS, $g_{m3}$=15 mS, $C_2$=300 fF, $C_{gs1}$≈70 fF, and $Q_{CG}$≈1.5. Therefore, $L_s$≈1.3 nH, which is a realizable on-chip inductor value.

As for the load impedance, the effective load reactance should become zero at both modes of operation, i.e., the imaginary part on the right side of equations (2) and (6) must be equal to zero simultaneously. The exact expression for $L_2$ becomes quite complicated. Nonetheless, we make some first order approximations to gain better insight. In equation (2), if $C_{PL1}$ is neglected, the load is defined by the series combination of inductors $L_1$ and $L_2$ resonating with $C_{L1}$. In equation (6), if we neglect the parasitic branch, then the load becomes the parallel combination of $L_2$ and $C_{L2}$. In other words, $L_2$ becomes subject to the following constraints:

$$\omega_{0,CS} \approx \frac{1}{\sqrt{(L_1+L_2)\cdot C_{L1}}} \text{ and } \omega_{0,CG} \approx \frac{1}{\sqrt{L_2 \cdot C_{L2}}} \quad (9)$$

Values for the exemplary design are $L_1$=8 nH, $L_2$=3.1 nH, $C_{L1}$≈70 fF, $C_{L2}$≈320 fF (at 4.9 GHz with $M_{SW1}$ ON and $M_{SW2}$ ON).

In the WB mode, the TC LNA input matching network is designed to transform the transconductance of transistor $M_3$, $1/g_{m3}$, downwards to match it to a typical source resistance of 50 Ω, since $g_{m3}$<20 mS. In applications where $g_{m3}$>20 mS, to meet certain design aspects, an upward impedance transformation network is needed to match it to 50Ω. In such applications, a tapped-inductor (TI) LNA may be used instead.

Figure 9:
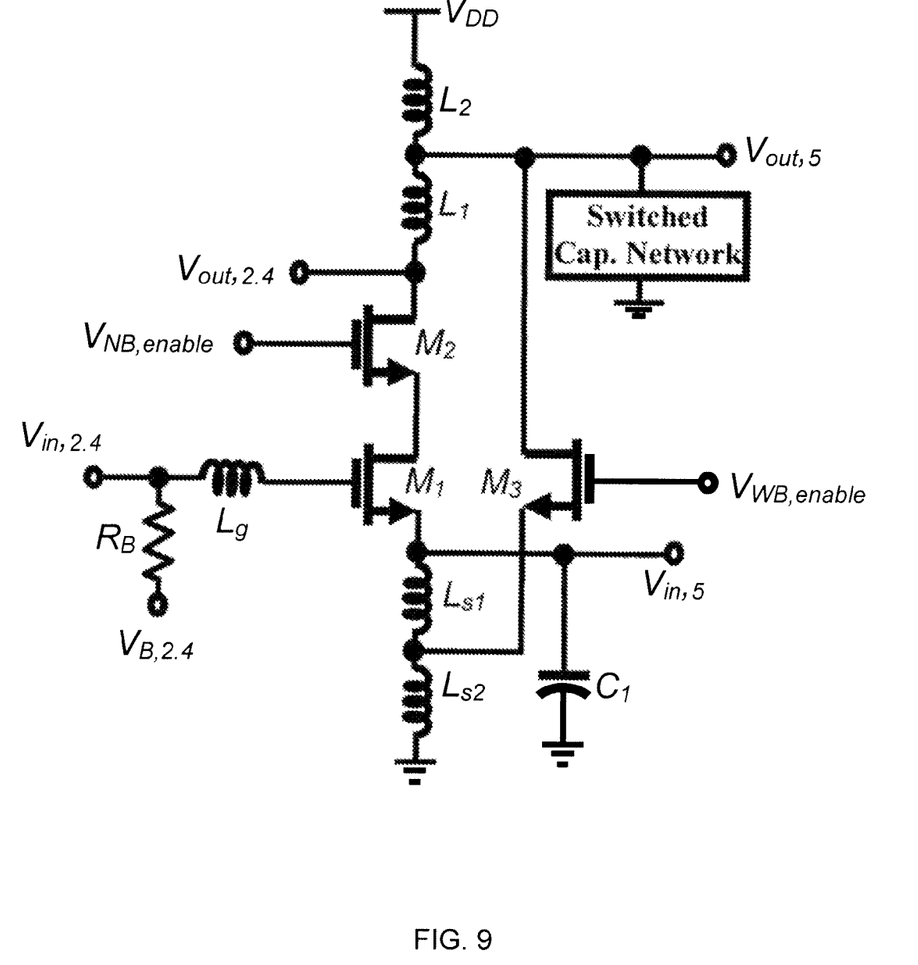
FIG. 9 shows an exemplary tapped-inductor (TI) LNA according to an embodiment of the present invention.

FIG. 9 shows a TI LNA according to an embodiment of the present invention. The TI LNA is similar to the TC LNA in FIG. 1, the difference being that the TI LNA comprises a tapped-inductor input matching network instead of the tapped-capacitor input network of the TC LNA. The tapped-inductor input matching network comprises inductors $L_{s1}$ and $L_{s2}$ and capacitor $C_1$ with the source of the common gate transistor $M_3$ connected between inductors $L_{s1}$ and $L_{s2}$. The tapped-inductor input matching network provides upward impedance transformation in the WB mode, e.g., for applications where $g_{m3}$>20 mS.

The operation principles of TI LNA are very similar to that of TC LNA. The only difference lies in the realization of the input matching networks. More precisely, in the NB mode of the TI LNA, the real part of the input impedance of the common source amplifier is defined by $$\text{Re}[Z_{in,CS}] \approx \frac{g_{m1}(L_{s1}+L_{s2})}{[1+C_1(L_{s1}+L_{s2})s^2]C_{gs1}} \quad (10)$$

The imaginary part of the input impedance is resonated out by proper selection of $L_g$.

In the WB mode, the tapped inductor network provides upward impedance transformation of $1/g_{m3}$ given by $$\text{Re}[Z_{in,CG}] \approx \left(\frac{L_{s1}+L_{s2}}{L_{s2}}\right)^2 \cdot \frac{1}{g_{m3}} \quad (11)$$

The resonant frequency is $$\omega_{0,CG} \approx \frac{1}{\sqrt{(L_{s1}+L_{s2})C_1}} \quad (12)$$

while the network Q is $$Q_{CG}=50\cdot\omega_{0,CG}C_1 \quad (13)$$

In an exemplary design, the TI LNA is used for 802.11a/b/g and PSB standards, where the NB mode covers WLAN 802.11b/g at 2.4 GHz, and the WB mode accommodates the PSB at 4.9 GHz and WLAN 802.11a from 5.1-5.9 GHz, as shown in FIG. 9. In the exemplary design, the inductor and capacitor values are $L_g$=19.7 nH, $L_{s1}$=0.36 nH, $L_{s2}$=1.4 nH, $L_1$=8.5 nH, $L_2$=2.3 nH, C1=0.135 pF, $C_{4.9}$=85 f, and $C_{5.2}$=115 f. The transistors are MOSFETs fabricated using a 0.13 μm CMOS process with dimensions of $M_1$=$M_2$=100/0.12 μm, and $M_3$=150/0.12 μm.

Experimental Results

Figure 10A:
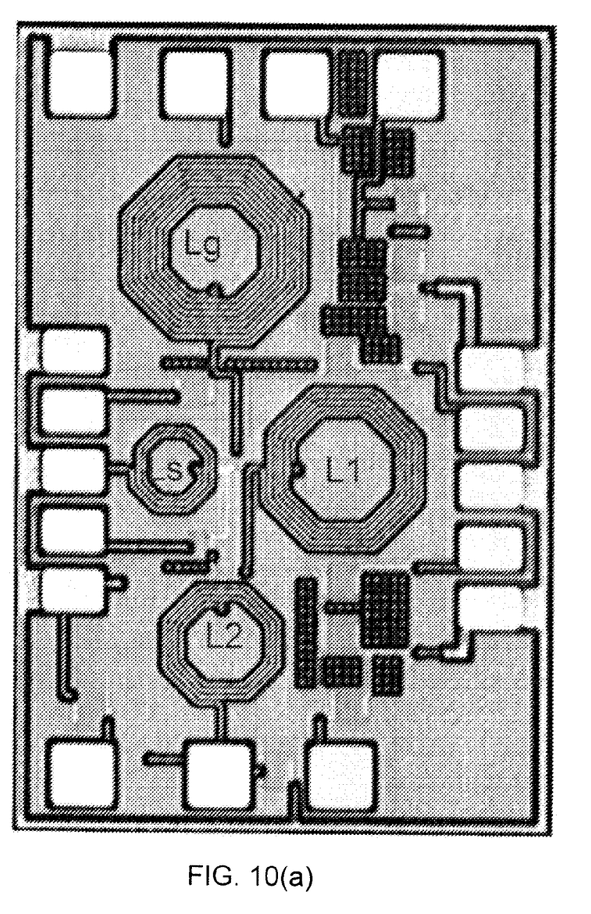
FIGS. 10(a) and 10(b) show die photos of a TC LNA and a TI LNA, respectively, according to an embodiment of the present invention.
Figure 10B:
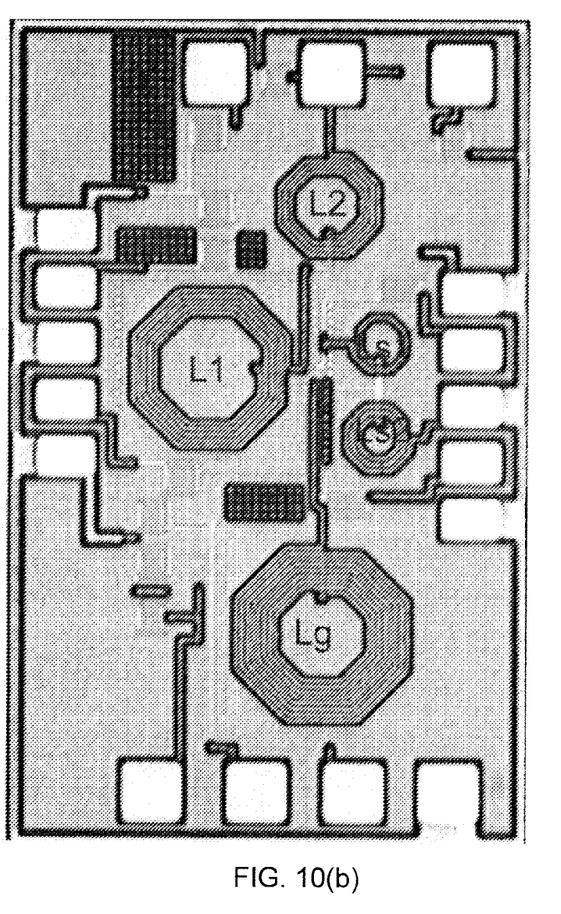
Figure 11:
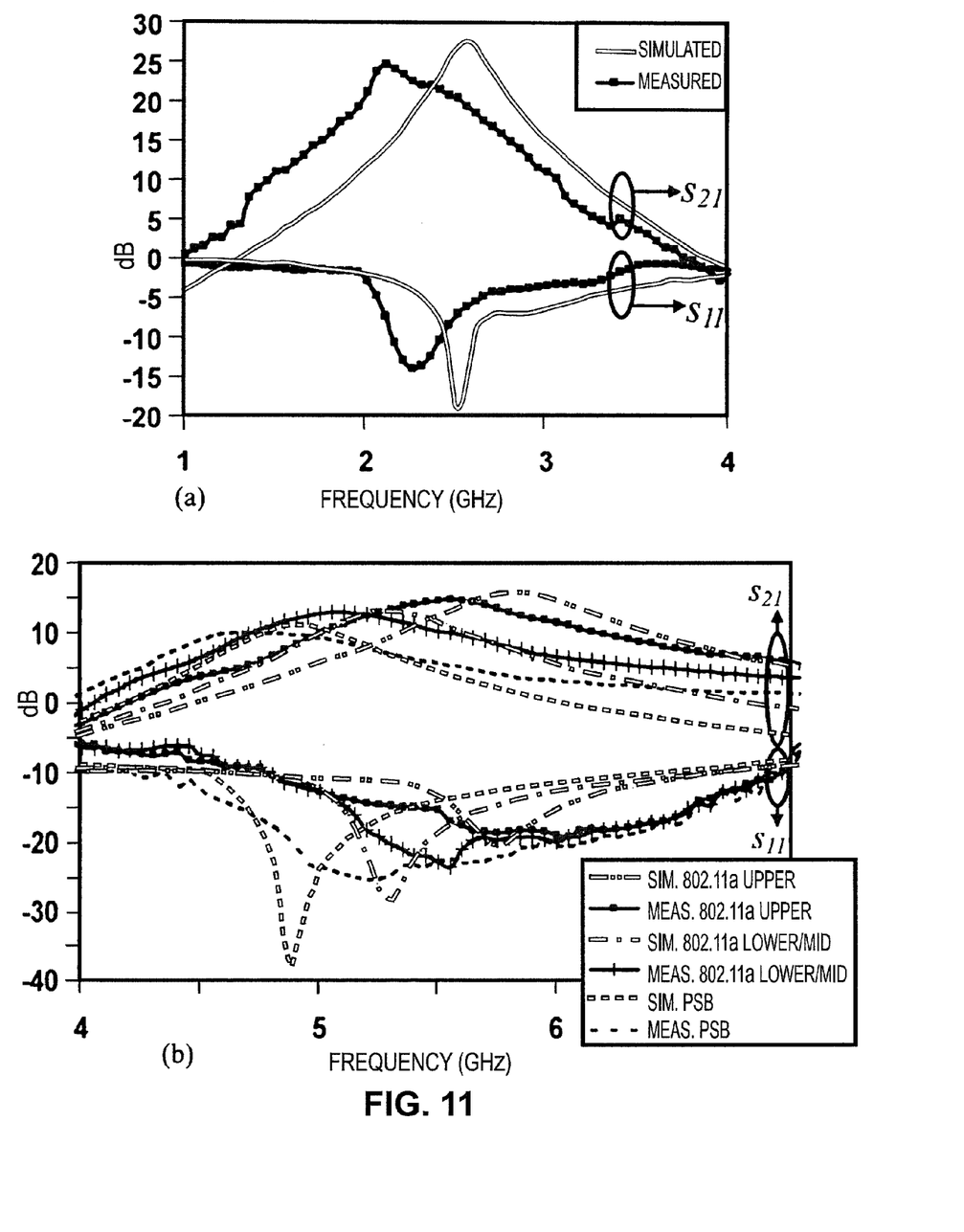
FIGS. 11(a) and 11(b) show the simulated and measured results of the $s_{11}$ and $S_{21}$ of the TC LNA in the NB and WB modes, respectively, according to an embodiment of the present invention.
Figure 12:
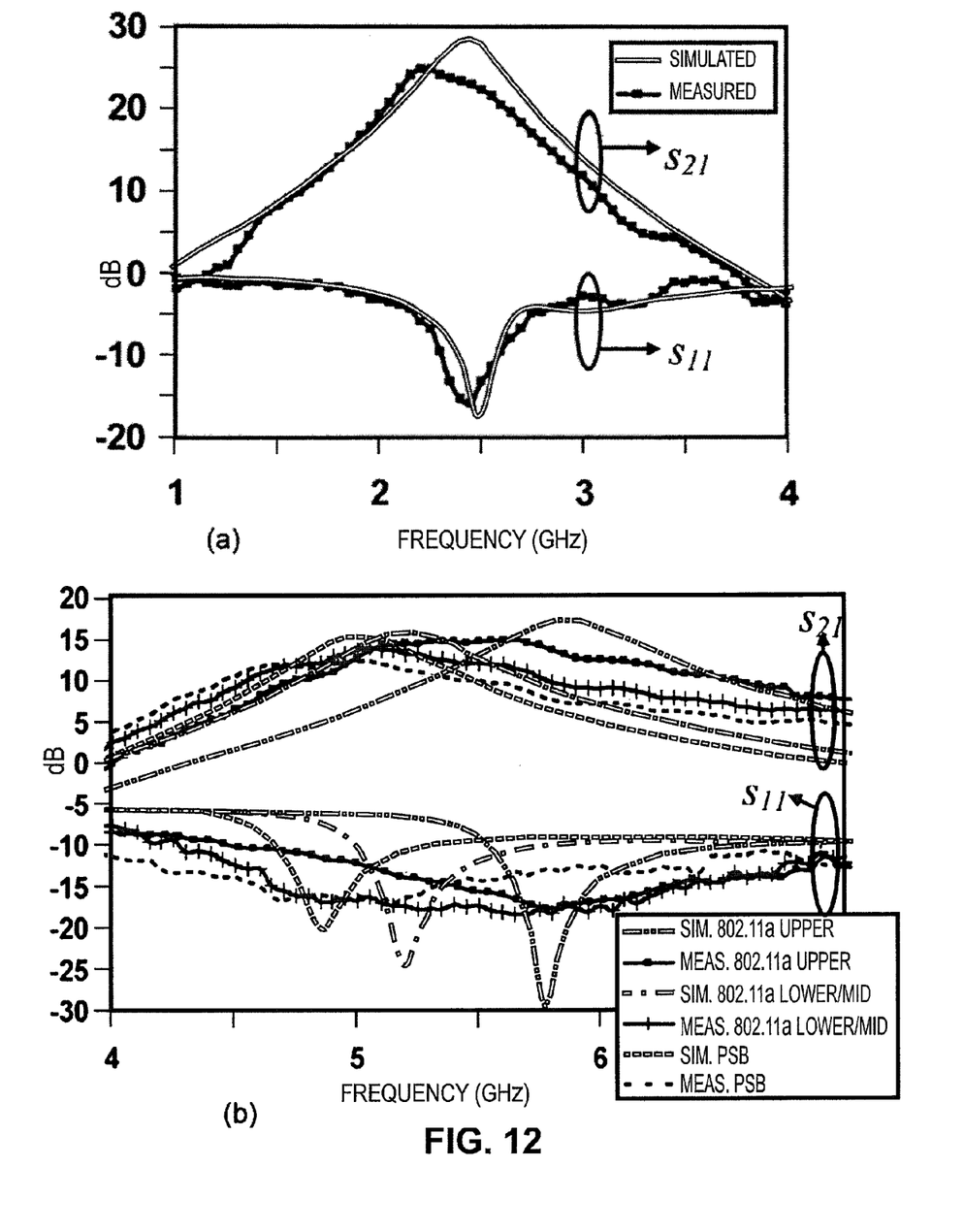
FIGS. 12(a) and 12(b) show the simulated and measured results of the $s_{11}$ and $S_{21}$ of the TI LNA in the NB and WB modes, respectively, according to an embodiment of the present invention.

A TC LNA and a TI LNA according to the exemplary designs have been fabricated in a 0.13 μm CMOS process occupying areas of 0.94×0.51 mm² and 1.02×0.56 mm², respectively. All inductors have been integrated on-chip. The chip die photos for the TC LNA and TI LNA are shown in FIGS. 10(a) and 10(b), respectively, in which the inductors have been labeled. On-wafer measurements were carried out to characterize the s-parameters, noise figure (NF), and linearity of the LNA FIGS. 11(a) and 11(b) show the simulated and measured results of the $s_{11}$ and $S_{21}$ of the TC LNA in the NB and WB modes, respectively. FIGS. 12(a) and 12(b) show the simulated and measured results of the $s_{11}$ and $S_{21}$ of the TI LNA in the NB and WB modes, respectively. In all cases, the measured $S_{21}$ is slightly shifted downwards in frequency due to unaccounted parasitics during extraction. Another observation is that for simulations in WB mode, $s_{11}$ displays dips at the resonant frequency of the load, which is counter-intuitive to the low Q behavior of the input matching network discussed above. Simulations demonstrate that this is caused by $M_3$'s finite $r_o$ which allows the load impedance to affect the input impedance. Although this did not show up strongly in the measurements, all measured $s_{11}$, nonetheless, are less than −10 dB at frequency ranges of interest, demonstrating the validity of reusing inductors for the input matching networks.

Figure 13:
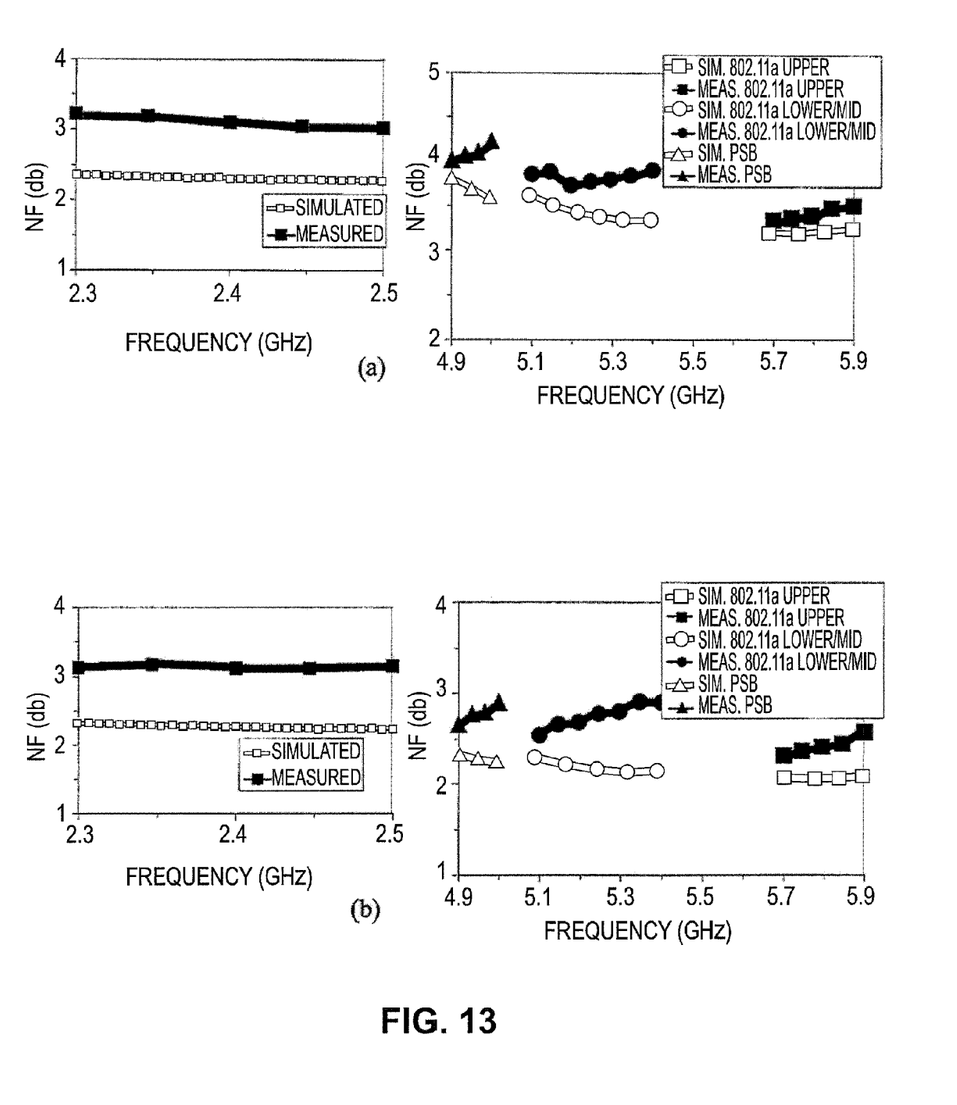
Figure 14:
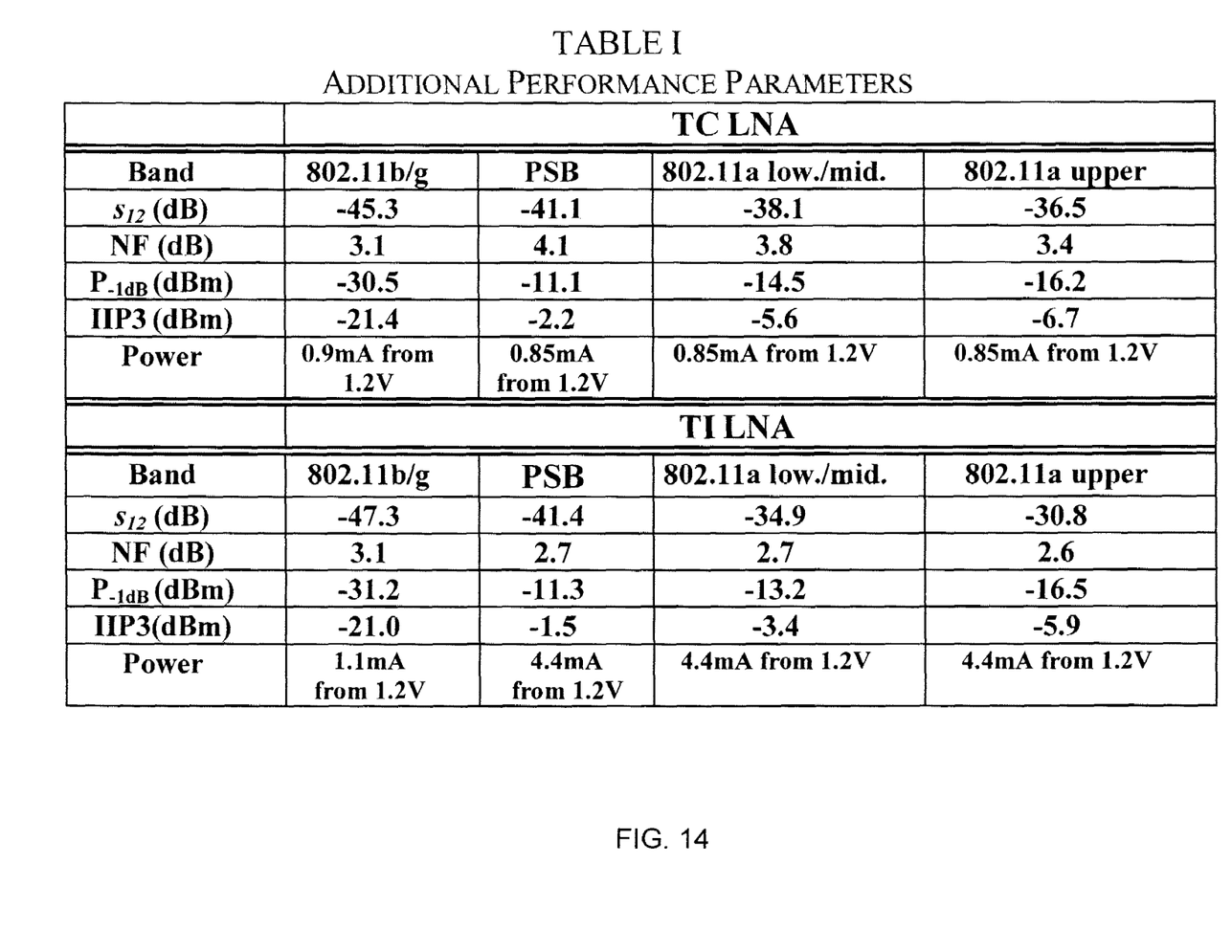
FIG. 14 shows a table summarizing performance parameter measurements for the TC LNA and the TI LNA according to an embodiment of the present invention.

Additional performance parameter measurements for all circuit configurations are summarized in Table I shown in FIG. 14. The TC LNA is inherently suited for low power operation as discussed above. The common gate transistor, biased at 0.85 mA from 1.2 V, has a $g_m$ of 15 mS. This input impedance was transformed downward to match 50 Ω. Conversely, the TI LNA draws 4.4 mA from 1.2 V, and has a $g_m$ of 55 mS. The input impedance was transformed upward to match 50 Ω. Also, Table I shows that the $P_{-1dB}$ and IIP3 at 2.4 GHz are quite low. Extensive simulations have shown that this traces back to the source follower output buffer used to drive the external 50 Ω for both the TC LNA and the TI LNA outputs in all configurations. Due to insufficient $V_{DS}$ of the buffer's current source, an excessive signal swing at its output drove it into triode, thereby decreasing the overall gain and making $P_{-1dB}$ and IIP3 occur at lower than expected input powers. FIGS. 13(a) and (b) show the simulated and measured NF of the TC LNA and TI LNA, respectively. All measured noise figures match within 0.8 dB of their simulated values.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

The invention claimed is:

1. A low noise amplifier (LNA), comprising:
 a common source transistor configured to amplify an input signal having a frequency in a narrowband (NB);
 a common gate transistor configured to amplify an input signal having a frequency in a wideband (WB); and
 an impedance matching network coupled to the common source transistor and the common gate transistor, wherein the impedance matching network is configured to reuse at least one inductor to provide input impedance matching for the common source transistor in the NB and the common gate transistor in the WB.

2. The LNA of claim 1, wherein the impedance matching network comprises a plurality of inductors and a capacitor coupled in a tapped-inductor configuration.

3. The LNA of claim 1, wherein the impedance matching network comprises a plurality of capacitors and an inductor coupled in a tapped-capacitor configuration.

4. The LNA of claim 1, wherein the wideband spans a frequency range of at least 0.5 Gigahertz.

5. The LNA of claim 4, wherein the narrowband is centered at a frequency of approximately 2.4 Gigahertz.

6. The LNA of claim 4, wherein the wideband is separated from the narrowband by at least one Gigahertz.

7. The LNA of claim 6, wherein the wideband is separated from the narrowband by at least two Gigahertz.

8. The LNA of claim 1, wherein the input impedance matching network is configured to provide impedance matching for a source resistance of approximately 50 $\Omega$.

9. The LNA of claim 1, wherein the input impedance matching network is coupled to a source of the common source transistor and a source of the common gate transistor.

10. The LNA of claim 1, further comprising a load network coupled to the common source transistor and the common gate transistor, wherein the load network is configured to reuse a load inductor to resonant at a frequency in the narrowband and a frequency in the wideband.

11. The LNA of claim 10, further comprising a switched capacitor network coupled to the load network for tuning the resonant frequency of the load network within the wideband.

12. The LNA of claim 11, wherein the switched capacitor network comprises at least one capacitor and at least one switch transistor coupled to the capacitor.

13. The LNA of claim 12, wherein the switched capacitor network is configured to tune the load network to at least two different resonant frequencies within the wideband by switching the at least one switch transistor between an on state and an off state.

14. The LNA of claim 10, wherein the load network comprises a first load inductor and a second load inductor, and the common gate transistor is coupled between the first and second load inductors.

15. A low noise amplifier (LNA), comprising:
 a common source transistor adapted to amplify an input signal having a frequency in a narrowband (NB);
 a common gate transistor adapted to amplify an input signal having a frequency in a wideband (WB); and
 a load network coupled to the common source transistor and the common gate transistor, wherein the load network is configured to reuse a load inductor to resonant at a frequency in the NB and a frequency in the WB.

16. The LNA of claim 15, wherein the wideband spans a frequency range of at least 0.5 Gigahertz.

17. The LNA of claim 16, wherein the narrowband is centered at a frequency of approximately 2.4 Gigahertz.

18. The LNA of claim 16, wherein the wideband is separated from the narrowband by at least one Gigahertz.

19. The LNA of claim 18, wherein the wideband is separated from the narrowband by at least two Gigahertz.

20. The LNA of claim 15, further comprising a switched capacitor network coupled to the load network for tuning the resonant frequency of the load network within the wideband.

21. The LNA of claim 20, wherein the switched capacitor network comprises at least one capacitor and at least one switch transistor coupled to the capacitor.

22. The LNA of claim 21, wherein the switched capacitor network is configured to tune the load network to at least two different resonant frequencies within the wideband by switching the at least one switch transistor between an on state and an off state.

23. The LNA of claim 15, wherein the load network comprises a first load inductor and a second load inductor, and the common gate transistor is coupled between the first and second load inductors.

* * * * *